Figure 1:
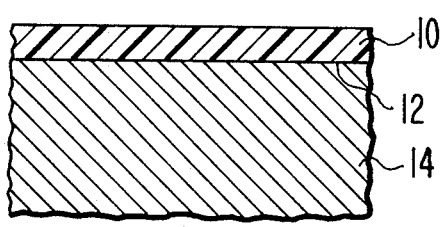

United States Patent [19]
Sonneborn

[11] 3,962,004
[45] June 8, 1976

[54] PATTERN DEFINITION IN AN ORGANIC LAYER

[75] Inventor: Kurt Jacques Sonneborn, Lebanon, N.J.

[73] Assignee: RCA Corporation, New York, N.Y.

[22] Filed: Nov. 29, 1974

[21] Appl. No.: 528,402

[52] U.S. Cl. ................................. 156/11; 96/35.1; 96/36.2; 156/13; 156/17; 427/95; 427/259; 427/264; 427/407
[51] Int. Cl.² .......................................... C23F 1/04
[58] Field of Search ............... 96/35.1, 36.2; 156/3, 156/7, 8, 13, 17, 11; 427/93, 95, 259, 264, 271, 402, 407

[56] References Cited
UNITED STATES PATENTS

| | | |
|---|---|---|
| 3,405,017 | 10/1968 | Gee ...................................... 156/13 |
| 3,482,977 | 12/1969 | Baker .................................... 156/17 |
| 3,549,368 | 12/1970 | Collins et al. .......................... 156/17 |

*Primary Examiner*—William A. Powell
*Assistant Examiner*—Brian J. Leitten
*Attorney, Agent, or Firm*—H. Christoffersen; Robert P. Williams; Thomas H. Magee

[57] ABSTRACT

An improved method of defining a pattern in a layer of organic material includes depositing a relatively thin layer of silicon dioxide on the layer of organic material, applying to the silicon dioxide layer a film of primer solution comprising a silane derivative, and then forming a photoresist etch mask on the film. By utilizing an ultrasonic etch bath, a uniform and well-defined pattern is etched in the layer of organic material.

8 Claims, 8 Drawing Figures

PATTERN DEFINITION IN AN ORGANIC LAYER

The invention herein described was made in the course of or under a contract or subcontract thereunder with the Department of the Navy.

This invention relates to a method of forming a pattern in a layer of organic material.

In manufacturing semiconductor devices, for example, an organic coating is sometimes formed on a surface of a semiconductor device in order to protect the surface from undesirable contamination which may affect the electrical characteristics of the device during its operation. The source of the contamination may be the atmosphere which contains both moisture and other substances which will ionize with water at the semiconductor surfaces or may be gross impurities such as pieces of metal which may contact the semiconductor device causing electrical short-circuiting or mechanically abrade or otherwise damage the device. In order to effectively protect the semiconductor surface from such contamination, it is necessary that the protective material adhere well to the semiconductor device.

The semiconductor device on which a layer of such protective material is formed is often a semiconductor wafer which is subsequently separated into pellets in making individual semiconductor devices. In a typical separation process, a pattern is etched in the layer of protective material by using a photoresist etch mask made by conventional photolithographic processes. Such a pattern defines the edges of the individual pellets and is utilized as an etch mask for etching the semiconductor wafer in order to separate the wafer into the individual pellets.

Organic coatings have also been used as insulating coatings between deposited conductors in multilevel metallization systems for semiconductor devices or thick or thin film integrated circuit devices and the like. Contact opening patterns, for example, are formed in these organic coatings by photolithographic processes.

It is desirable that the pattern which is etched in the organic material have uniform and well-defined edges. In using an organic material such as, for example, a silicone resin, it has been difficult to achieve such a uniform and well-defined protective pattern due to the poor adhesion of the photoresist etch mask to the organic material and also due to severe undercutting and scalloping of the organic material.

FIGS. 1 to 8 are a series of cross-sectional views illustrating a succession of steps in using the present improved method.

The improved method of the present invention may be used to define a layer 10 of organic material, as shown in FIG. 1, on a surface 12 of a substrate 14 which is only generally shown here for brevity and clarity. The substrate 14 may be, for example, a silicon wafer that has integrated circuitry and interconnection metallization completed. The substrate 14 may also be, for example, an insulating substrate having a first level metal pattern of a multilevel interconnection system thereon. It is preferable that the surface 12 of the substrate 14 be first cleaned, using conventional cleaning processes, for example. After cleaning, the layer 10 of organic material is formed on the surface of the substrate 14. The organic material may comprise any suitable material capable of forming a coating when properly applied to the surface 12 of the substrate 14, preferably a resin such as, for example, the silicone resin available commercially as DC 648 from the Dow Corning Company, Midland, Mich. DC 648 is a solution of 50% of the silicone resin by weight in xylene, and is preferably applied by using a photoresist whirler spinning at about 6,000 rpm for approximately 20 seconds. The layer 10 of silicone resin is then cured by baking the substrate 14 in air in a 125°C oven for about 1 hour, then in a 150°C oven for about 1 hour, and finally in a 300°C oven for about 4 hours.

Figure 2:
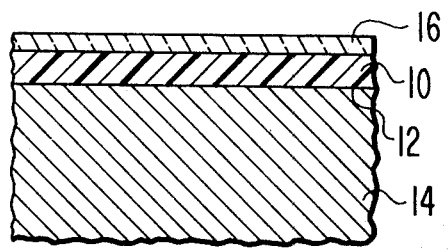

A relatively thin layer 16 of silicon dioxide is now deposited, as shown in FIG. 2, on the layer 10 of resin by using any conventional deposition technique. A typical silicon dioxide deposition technique is to chemically react a gaseous silane such as, for example, silicon tetrahydride (SiH4) with oxygen in the presence of an inert gas such as, for example, nitrogen. In the preferred embodiment, the substrate 14 is preheated to a temperature of about 300°C for approximately 2 minutes, and the layer 10 of resin is exposed to silicon tetrahydride, oxygen, and nitrogen in the ratios of 1:3:100, by volume, for approximately 2 minutes while maintaining the wafer at a temperature of about 300°C. Using this procedure, a relatively thin layer 16 of silicon dioxide, about 1,000 to 1,400A in thickness, is deposited on the layer 10 of resin.

Figure 3:
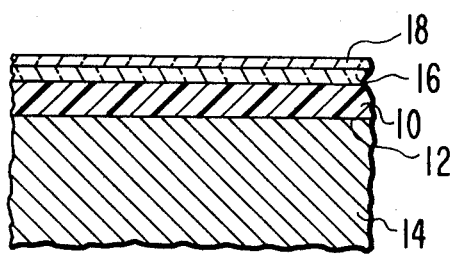

A film 18 of primer solution comprising a silane derivative, is applied, as shown in FIG. 3, on the layer 16 of silicon dioxide at about 3,000 rpm for approximately 20 seconds using a photoresist whirler. The primer solution used in the preferred embodiment is Dow Corning Primer Z-6079, which comprises hexamethyldisilazane and is available commercially from the Dow Corning Company, Midland, Mich. Primer solutions comprising other silane derivatives may be used such as, for example, phenyltriethoxysilane or phenyltrichlorosilane.

Figure 4:
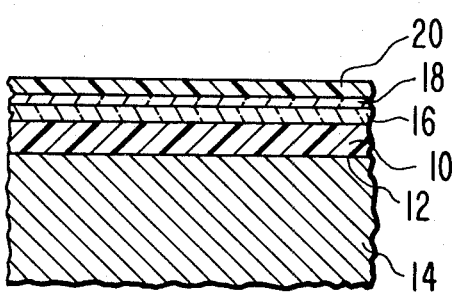
Figure 5:
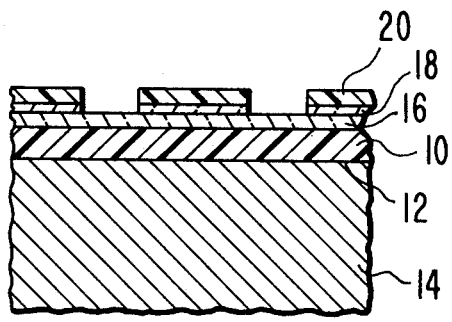

A layer 20 of photoresist is now formed, as shown in FIG. 4, on the film 18 of primer solution. The photoresist may be any conventional photoresist such as SC Waycoat photoresist which is commercially marketed by the Philip A. Hunt Corporation, Palisades Park, N.J. After depositing the photoresist on the film 18 using a photoresist whirler, the substrate 14 is baked at about 75°C for approximately 30 minutes. Using conventional photoresist processes, the layer 20 of photoresist is selectively exposed to light for about 60 seconds through a mask and then developed using a standard developer such as, for example, a solution of Kodak Thin Film Resist Developer, presently marketed by the Eastman Kodak Co., Rochester, N.Y., under the trade name "KTFR" Developer, and toluene in the ratio of 2:3, by volume. The substrate 14 is, preferably, immersed in the developer for about 1 minute without agitation and 1 minute with agitation, spin dried at about 1,500 rpm using the photoresist whirler, and then baked at about 75°C for approximately 30 minutes. The developer exposes, as shown in FIG. 5, sections of the layer 16 of silicon dioxide by removing parts of the photoresist layer 20 and also portions of the primer solution film 18 adjacent to these parts.

Figure 6:
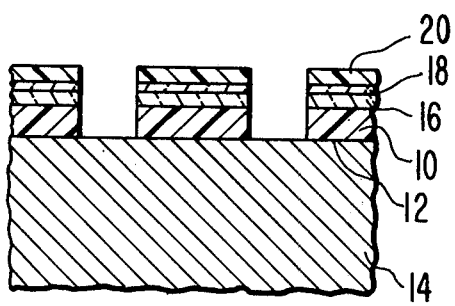

Utilizing the layer 20 of photoresist as an etch mask, the substrate 14 is next immersed in an ultrasonic etch bath whereby the exposed sections of the silicon dioxide layer 16 are removed and a pattern is etched in the layer 10 of resin, as shown in FIG. 6. The preferred etchant comprises a solution of N-methyl pyrrolidone, tetra methyl ammonium hydroxide in 25% methanol, and isopropanol in the ratios of 10:1:30, by volume.

Preferably, the substrate 14 is immersed in the ultrasonic etch bath, which is maintained at a temperature of about 35°C, for approximately 30 seconds, rinsed in water for approximately 3 minutes, and then spin dried at about 1,500 rpm using the photoresist whirler.

Figure 7:
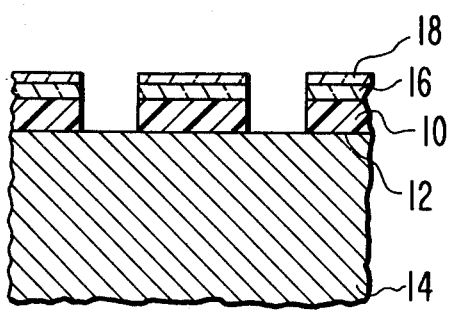

The layer 20 of photoresist is now removed by using a remover solution which does not damage the layer of resin. In the present embodiment, the photoresist layer 20 is removed, as shown in FIG. 7, by spraying the substrate 14 at a pressure of about 50 pounds per square inch ($3.4 \times 10^7$ dynes/cm$^2$) with, preferably, Cobehn spray-clean solvent, an ether solution commercially available from Cobehn, Inc., Fairfield, N.J. The photoresist layer 20 may also be removed by spraying the substrate 14 with trichloroethylene.

Figure 8:
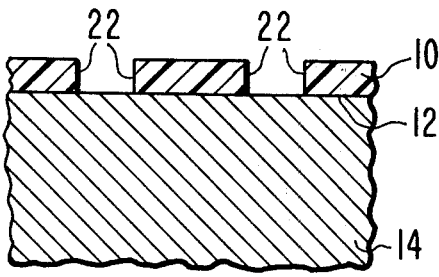

After the layer 20 of photoresist is removed, any remaining portions of the primer solution film 18 and silicon dioxide layer 16 may now be removed, as shown in FIG. 8, by using known conventional procedures. Next, the layer 10 of resin is baked in air, preferably, at about 300°C for approximately 15 minutes, in order to remove any moisture which may be present. If desired, the substrate 14 may then be cleaned by immersing it in a solution of water and hydrochloric acid in the ratio of 1:1, by volume, at about 60°C for approximately 1 minute, rinsing it in water for about 2 minutes, and spinning it dry.

Although the present embodiment of the improved method has included the application of a film 18 of primer solution and the use of an ultrasonic bath to further improve the pattern definition, such steps are not necessary for the present method which may be used simply by depositing the layer 16 of silicon dioxide on the layer 10 of organic material prior to forming the layer 20 of photoresist.

The silane deposition step of the improved method results in the formation of a relatively thin layer of silicon dioxide 16 on the layer 10 of organic material. This oxide layer 16 adheres well to the layer 10 of organic material and serves as an adherent base which significantly improves the adhesion of the photoresist layer 20, since the photoresist layer 20 adheres much better to the oxide layer 16 than to the layer 10 of organic material. The application of the film 18 of primer solution serves as a silane coupling base which further enhances the photoresist adhesion. The use of an ultrasonic bath, together with the firmly adhering photoresist etch mask, results in a uniform and well-defined pattern of organic material whose edges 22, shown in FIG. 8, are neither severely undercut nor scalloped. Consequently, the organic material, a silicone resin in the preferred embodiment, adheres well to the individual semiconductor pellets, thereby effectively protecting the semiconductor surfaces from contamination.

What is claimed is:

1. In a method of forming a pattern in a layer of cured organic material on a substrate wherein an etch mask comprising a layer of photoresist is formed above said layer of organic material using conventional photolithographic processes and said pattern defined by said mask is etched in said layer of organic material, the improvement in said method comprising the step of depositing a layer of silicon dioxide on said layer of cured organic material prior to forming said etch mask.

2. A method as defined in claim 1 further comprising the step of applying a film of primer solution comprising a silane derivative on said layer of silicon dioxide prior to forming said etch mask.

3. A method as defined in claim 2 wherein said primer solution is hexamethyldisilazane and wherein said applying step is performed by spinning said substrate and said hexamethyldisilazane upon said layer of silicon dioxide using a photoresist whirler.

4. A method as defined in claim 1 wherein the step of etching said pattern in said layer of organic material is performed by etching said pattern in an ultrasonic etch bath.

5. A method as defined in claim 1 wherein said depositing step is performed by:
preheating said substrate to a temperature of about 300°C for approximately 2 minutes, and
exposing said layer of organic material to gaseous silane and oxygen in the presence of an inert gas for approximately 2 minutes while maintaining said substrate at a temperature of about 300°C, whereby a relatively thin layer of silicon dioxide about 1,000 to 1,400A in thickness is deposited on said layer of organic material.

6. A method as defined in claim 1 wherein said substrate is a silicon wafer and said layer of organic material is a silicone resin.

7. A method of forming a pattern in a layer of cured organic material on a substrate comprising the steps of:
depositing a layer of silicon dioxide on said layer of cured organic material,
applying a film of primer solution comprising a silane derivative on said layer of silicon dioxide,
forming a layer of photoresist on said film,
exposing selectively through a mask said layer of photoresist to light,
developing said layer of photoresist,
etching said pattern in said layer of cured organic material in an ultrasonic etch bath utilizing said layer of photoresist as an etch mask, and
removing said layer of photoresist.

8. A method as defined in claim 7 wherein said layer of cured organic material is a silicone resin and said substrate is a silicon wafer.

* * * * *